(12) United States Patent
West

(10) Patent No.: US 11,574,995 B2
(45) Date of Patent: Feb. 7, 2023

(54) HIGH VOLTAGE ISOLATED MICROELECTRONIC DEVICE

(71) Applicant: Texas Instruments Incorporated, Dallas, TX (US)

(72) Inventor: Jeffrey Alan West, Dallas, TX (US)

(73) Assignee: Texas Instmments Incorporated, Dallas, TX (US)

( * ) Notice: Subject to any disclaimer, the term of this patent is extended or adjusted under 35 U.S.C. 154(b) by 31 days.

(21) Appl. No.: 17/138,059

(22) Filed: Dec. 30, 2020

(65) Prior Publication Data
US 2022/0208956 A1  Jun. 30, 2022

(51) Int. Cl.
*H01L 49/02* (2006.01)

(52) U.S. Cl.
CPC ................................. *H01L 28/60* (2013.01)

(58) Field of Classification Search
CPC ............... H01L 21/76816; H01L 28/60; H01L 21/76838
See application file for complete search history.

(56) References Cited

U.S. PATENT DOCUMENTS

| | | |
|---|---|---|
| 9,299,697 B2 | 3/2016 | West et al. |
| 9,583,558 B2 | 2/2017 | West et al. |
| 10,109,574 B1 | 10/2018 | West et al. |

*Primary Examiner* — John A Bodnar
(74) *Attorney, Agent, or Firm* — Andrew R. Ralston; Frank D. Cimino

(57) ABSTRACT

A method forms a first voltage node of a high voltage component of a microelectronic device. The method also forms a plurality of dielectric layers. The method also forms a second voltage node of the high voltage component of the microelectronic device in a fourth position such that the plurality of dielectric layers is between the first voltage node and the second voltage node. During the forming a second voltage node step, a portion of a third layer in the plurality of dielectric layers, in a region outwardly positioned relative to the second voltage node, is removed to expose the second layer, in the plurality of dielectric layers, in the region.

16 Claims, 9 Drawing Sheets

HIGH VOLTAGE ISOLATED MICROELECTRONIC DEVICE

CROSS-REFERENCE TO RELATED APPLICATION

Not applicable.

BACKGROUND

The example embodiments relate to high voltage components in microelectronic devices, such as integrated circuits (IC singular, ICs plural).

High voltage microelectronic devices, sometimes referred to as or including isolation devices, can experience voltage differentials of 100 to 1000 $V_{RMS}$, or greater. A high voltage microelectronic device typically includes an internal electrical separation, which can be within a single or multiple IC packages. The isolation is included to prevent current flow between the isolated sections, while often permitting transmission of an AC signal between the isolated sections. For example, the AC signal may be accomplished by a large voltage differential across an internal capacitor, which is sometimes referred to as a high voltage capacitor due to the large voltage differential. An isolation IC also may be used for internal noise suppression or circuitry protection, or for safety purposes to prevent high voltage injury to someone near a device that includes the IC. Indeed, typically an isolation IC is constructed with a first set of high voltage pins positioned on a first side of the IC package and a second set of low voltage pins positioned on a second and opposite side of the IC package, with internal isolation between the two sets of voltage pins. Other design considerations may apply to the package itself to reduce the chance of arcing between the high voltage and low voltage pins, for example during testing of the IC package. Isolation ICs also may be used in various applications, including industrial, building and climate control, security systems, transportation, medical, robotics, motors, digital converters, telecommunications, and others.

Isolation between high differential metal nodes of the isolation IC is sometimes achieved with a number of dielectric layers. For example, a stack of dielectrics, from and between the high voltage node and the low voltage node may include first a relatively thin and first bandgap dielectric layer, such as silicon nitride (SiN), proximate the high voltage node, followed by a second and relatively thicker higher-bandgap dielectric, followed by a third layer (or a stack of layers forming the third layer) of an even thicker and highest-bandgap dielectric, between the thicker higher-bandgap dielectric and the low voltage node. The bandgap (electron mobility) of each layer differs, so that each layer provides some level of breakdown protection by a tradeoff between lower bandgap for a thin layer (e.g., SiN) and higher bandgap for a thicker layer.

While the preceding approach generally reduces or provides controlled breakdown in the direction (typically referred to as vertical) between the higher and lower voltage node, charge can leak into the thin first bandgap dielectric layer and also spread laterally. Accordingly, while the thin first bandgap layer may not fail in the vertical direction due to the addition of the other layers described above, it may instead undesirably leak or fail laterally in the layer spanning between higher and lower voltage metal nodes.

Accordingly, example embodiments are provided in this document that may improve on certain of the above concepts, as further detailed below.

SUMMARY

In one embodiment, a method forms a first voltage node of a high voltage component of a microelectronic device. The method also forms a plurality of dielectric layers, including: (i) forming a first layer in the plurality of dielectric layers in a first position that is fixed relative to the first voltage node, the first layer having a first thickness and a first bandgap; (ii) forming a second layer in the plurality of dielectric layers in a second position such that the first layer is between the second layer and the high voltage node, the second layer having a second thickness and a second bandgap; and (iii) forming a third layer in the plurality of dielectric layers in a third position such that the second layer is between the third layer and the high voltage node, the third layer having a third thickness and a third bandgap. The method also forms a second voltage node of the high voltage component of the microelectronic device in a fourth position such that the plurality of dielectric layers is between the first voltage node and the second voltage node, wherein during the forming a second voltage node step a portion of the third layer in a region outwardly positioned relative to the second voltage node is removed to expose the second layer in the region.

In another embodiment, a method forms a first voltage node of a high voltage component of a microelectronic device. The method also forms a plurality of dielectric layers adjacent the first voltage node. The plurality of dielectric layers includes: (i) a first dielectric layer farthest away, in the plurality of dielectric layers, from the first voltage node; and (ii) a second dielectric layer abutting the first dielectric layer and closer to the first voltage node relative to the first dielectric layer. The method also forms a second voltage node of a high voltage component of a microelectronic device adjacent the first dielectric layer, including etching a metal layer to provide the second voltage node wherein the etching fully etches through the first dielectric layer, to expose the second dielectric layer, in a regions lateral with respect to the second voltage node.

In another embodiment, there is a microelectronic device. The device comprises a first voltage node and a plurality of dielectric layers adjacent the first voltage node. The device also comprises a second voltage node positioned such that the plurality of dielectric layers are between the first voltage node and the second voltage node. The plurality of dielectric layers includes a first dielectric layer abutting the first voltage node and having a length greater than a length of the first voltage node and including sidewalls extending to a second dielectric layer, in the plurality of dielectric layers and abutting the first dielectric layer, the sidewalls having a shape that is not parallel to sidewalls of the first voltage node.

Other aspects are also disclosed and claimed.

DETAILED DESCRIPTION

Figure 1:
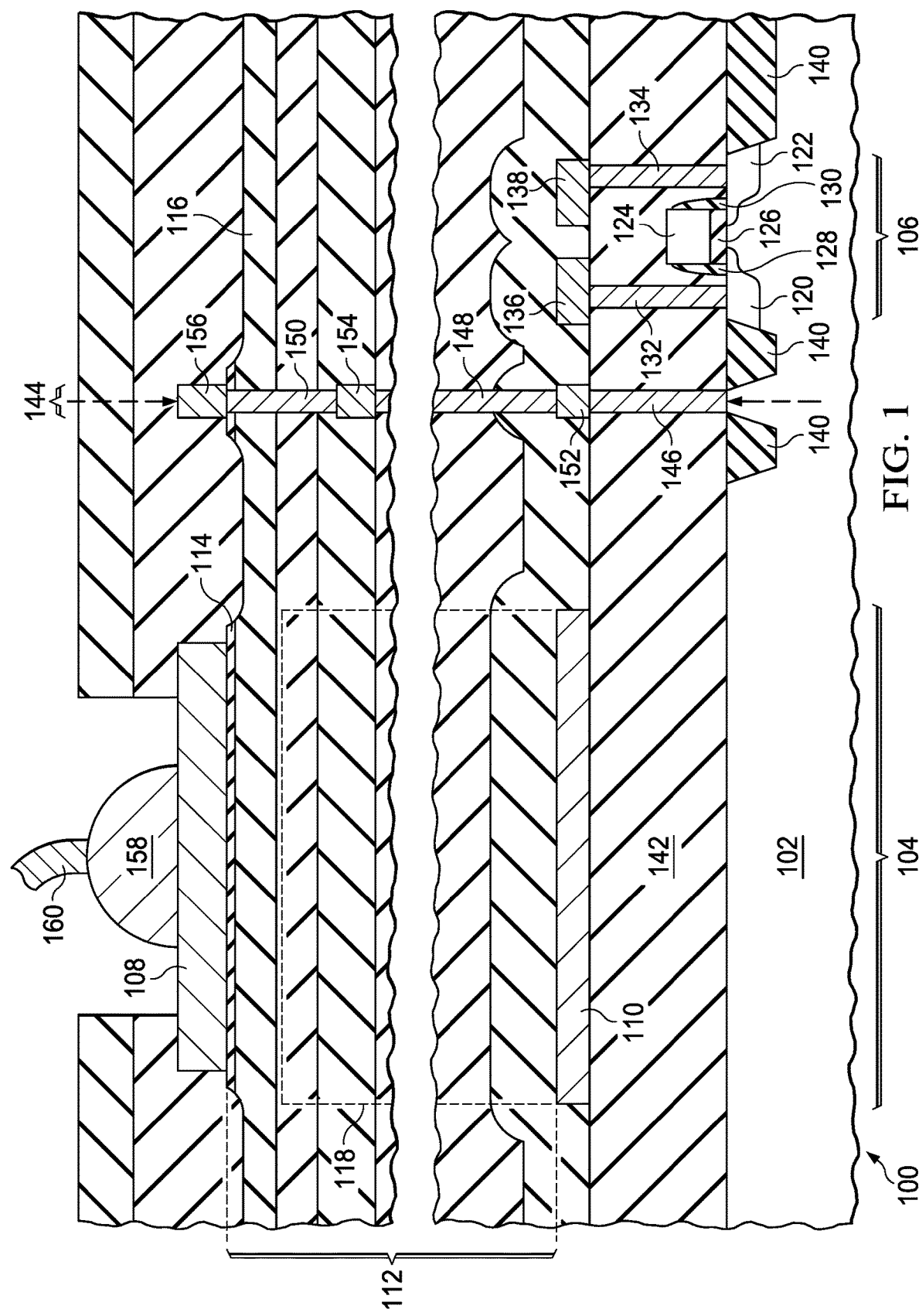
FIG. 1 illustrates a cross-section of an example embodiment microelectronic device 100 containing a high voltage component.

FIG. 1 illustrates a cross-section of an example embodiment microelectronic device 100 containing a high voltage component. In the present example, the microelectronic device 100 is described as an IC, and other configurations such as a standalone component or hybrid circuit are contemplated. Various aspects of the microelectronic device 100 are first introduced and described, while later FIGS. 2A through 2G further illustrate successive steps at forming certain of those aspects.

The microelectronic device 100 is formed in connection with a substrate 102, such as part of a semiconductor (e.g., silicon) wafer. The microelectronic device 100 includes a high voltage component, shown as a high voltage capacitor 104, and also may include a low voltage component, shown as a metal oxide semiconductor (MOS) transistor 106. The high voltage capacitor 104 may experience differential voltages in the range of 100 to 1,000 $V_{RMS}$ or greater, while the MOS transistor 106 may operate at 24 volts or less.

The high voltage capacitor 104 includes a high voltage node 108 and a low voltage node 110, with a dielectric layer stack 112 between the high voltage node 108 and the low voltage node 110. The dielectric layer stack 112 includes at least three layers, where each of those layers has a thickness and bandgap that distinguishes from the thickness and bandgap of the other two layers. Accordingly, the dielectric layer stack 112 includes a first dielectric layer 114, such as silicon nitride (SiN), proximate (e.g., along and in direct contact with) the high voltage node 108. The first dielectric layer 114 is the thinnest, and has the lowest relative bandgap, of the layers in the dielectric layer stack 112 (with bandgap stated in the relative, not absolute sense). Additionally, the dielectric layer stack 112 also includes a second dielectric layer 116, such as silicon oxynitride (SiON), next to the dielectric layer 114. The second dielectric layer 116 is thicker, and has a higher bandgap, than the dielectric layer 114. Lastly, the dielectric layer stack 112 also includes a third dielectric layer 118 (sometimes referred to as a layer stack 118), such as or including tetraethoxysilane (TEOS), between the second dielectric layer 116 and the low voltage node 110. The third dielectric layer 118 is the thickest, and has the highest relative bandgap, of the layers in the dielectric layer stack 112. The bandgap (electron mobility, or energy required to promote a charge carrier to a conduction band)) of each layer differs, so that each layer provides some level of breakdown protection by a tradeoff between lower bandgap for a thin layer (e.g., SiN) and higher bandgap for a thicker layer (e.g., TEOS). Each layer thickness of dielectric layer stack 112 may vary, where by way of example the first dielectric layer 114 may be 2,000 Å (200 nm), the second dielectric layer 116 may be 7,000 Å (700 nm), and the third dielectric layer 118, or layer stack 118, may be 145,000 Å (14.5 μm). Also, in some instances other materials may be selected and various chemistries used for forming same, for example as provided in the following three co-owned United States patents, all of which are hereby incorporated herein by reference: (1) U.S. Pat. No. 9,299,697, issued Mar. 29, 2016, and entitled "High breakdown voltage microelectronic device isolation structure with improved reliability"; (2) U.S. Pat. No. 9,583,558, issued Feb. 28, 2017, and entitled "High breakdown voltage microelectronic device isolation structure with improved reliability" and (3) U.S. Pat. No. 10,109,574, issued Oct. 23, 2018, and entitled "Structure and method for improving high voltage breakdown reliability of a microelectronic device".

The MOS transistor 106 includes a first source/drain region 120 and a second source/drain region 122 formed within the substrate 102, for example by implanting dopants into the substrate 102 that self-align relative to, and may extend under, a metal gate 124 (or gate stack) of the MOS transistor 106. A gate dielectric 126 is positioned between the gate 124 and the substrate 102, and insulator sidewalls 128 and 130 are formed along sidewalls of the metal gate 124. Each of the first source/drain region 120 and the second first source/drain region 122 is physically and electrically connected to a respective (e.g., metal) contacts 132 and 134. Each of the contacts 132 and 134 is physically and electrically connected to a respective conductive (e.g., metal) feature 136 and 138. While not shown, either or both of the conductive features 136 and 138 may connect to additional electrical paths, so as to couple signals to or from the first and second source/drain regions 120 and 122.

Various other aspects are shown in FIG. 1, with some indicated with reference identifiers and others understood in the art. For example, field oxides 140 are shown in various locations, for electrical isolation purposes. As another example, a pre-metal dielectric 142 is shown between the substrate 102 and the low voltage node 110. As still another example, a vertical conductive path 144 is shown, including a contact 146 (the term contact used generally before metal-1), vias 148 and 150 (the term via used generally after metal-1), and conductive features 152, 154, and 156, so that a signal may be coupled between a relatively upper surface of the microelectronic device 100 and the substrate 102. Also for electrical connectivity, the high voltage node 108 serves as a bond pad for a subsequent wirebond 158, shown connected to a wire 160.

Figure 2A:
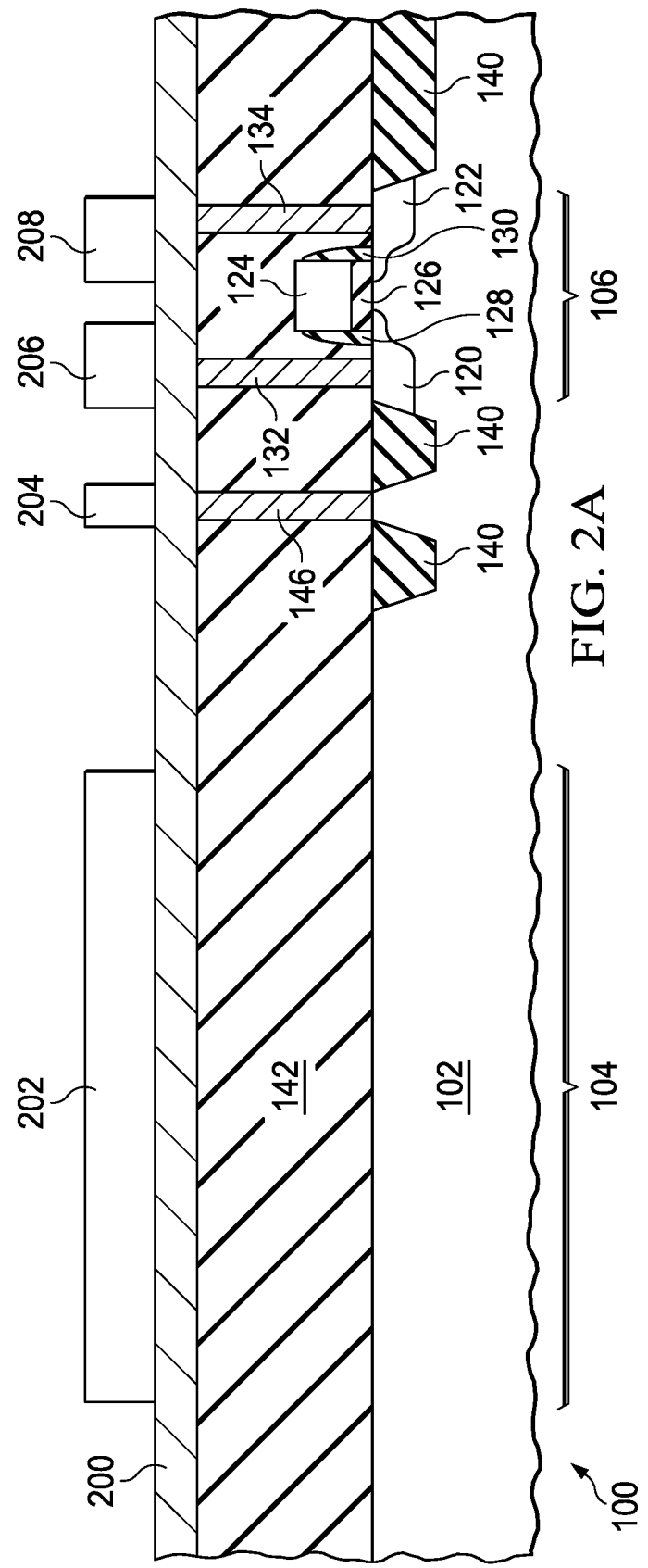
FIGS. 2A through 2G are cross-sectional views of the FIG. 1 microelectronic device depicted in successive stages of fabrication.
Figure 2B:
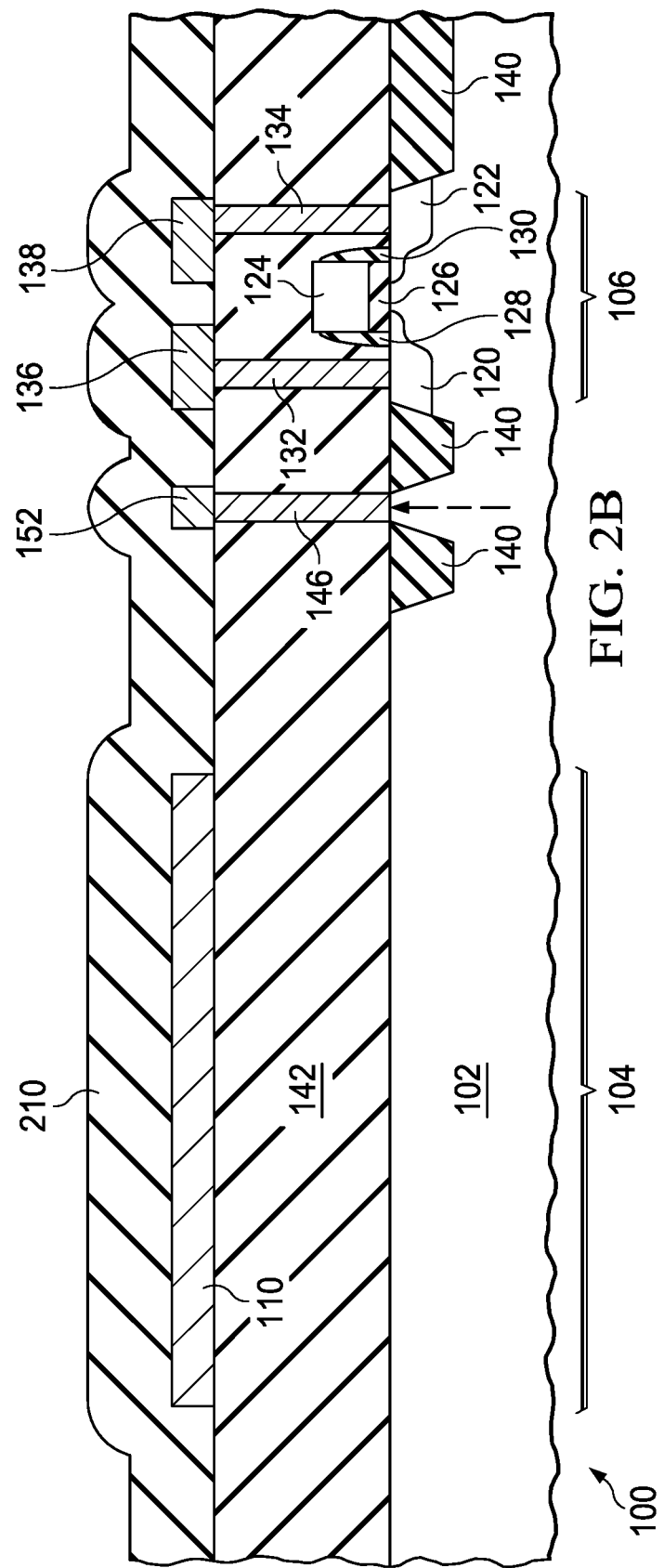
Figure 2C:
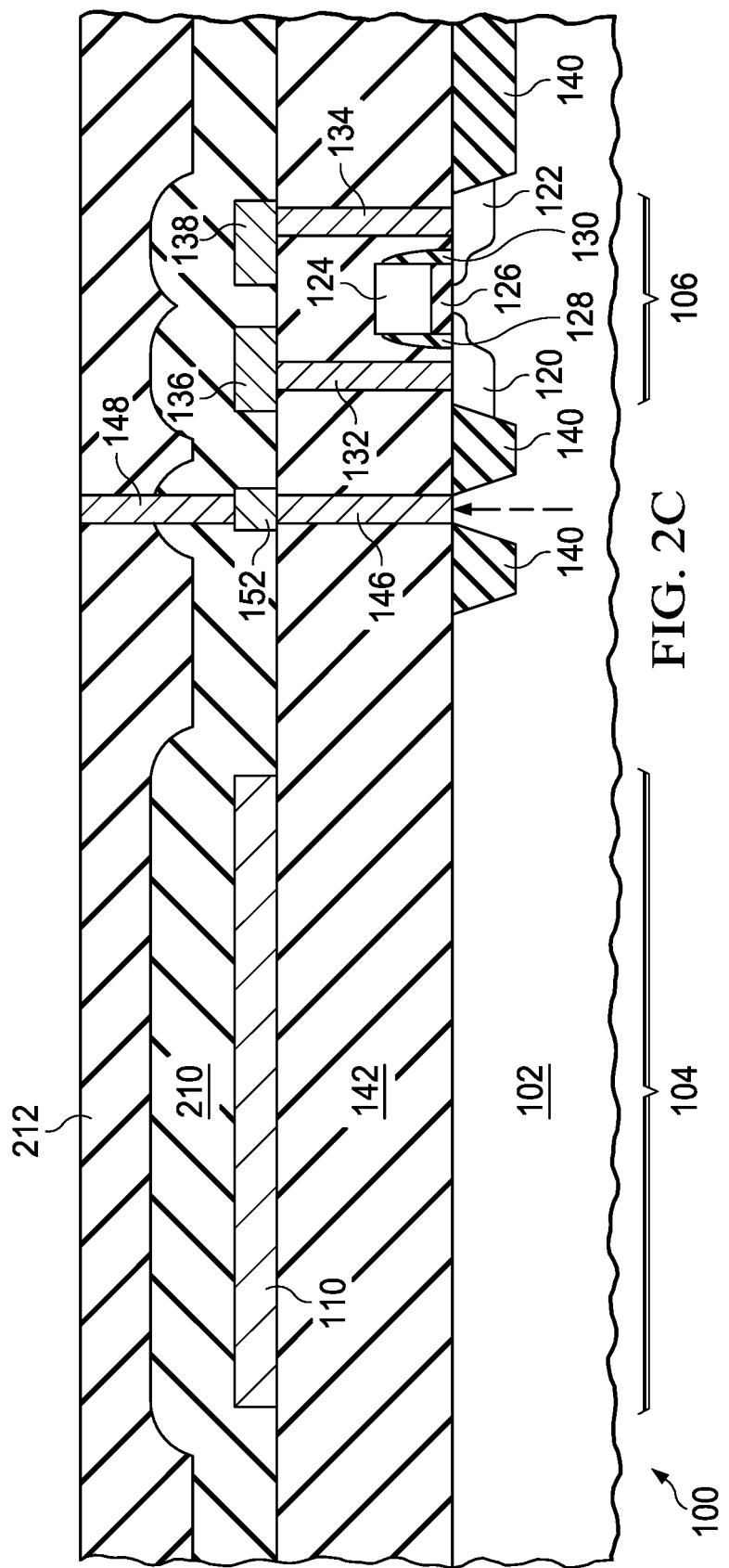
Figure 2D:
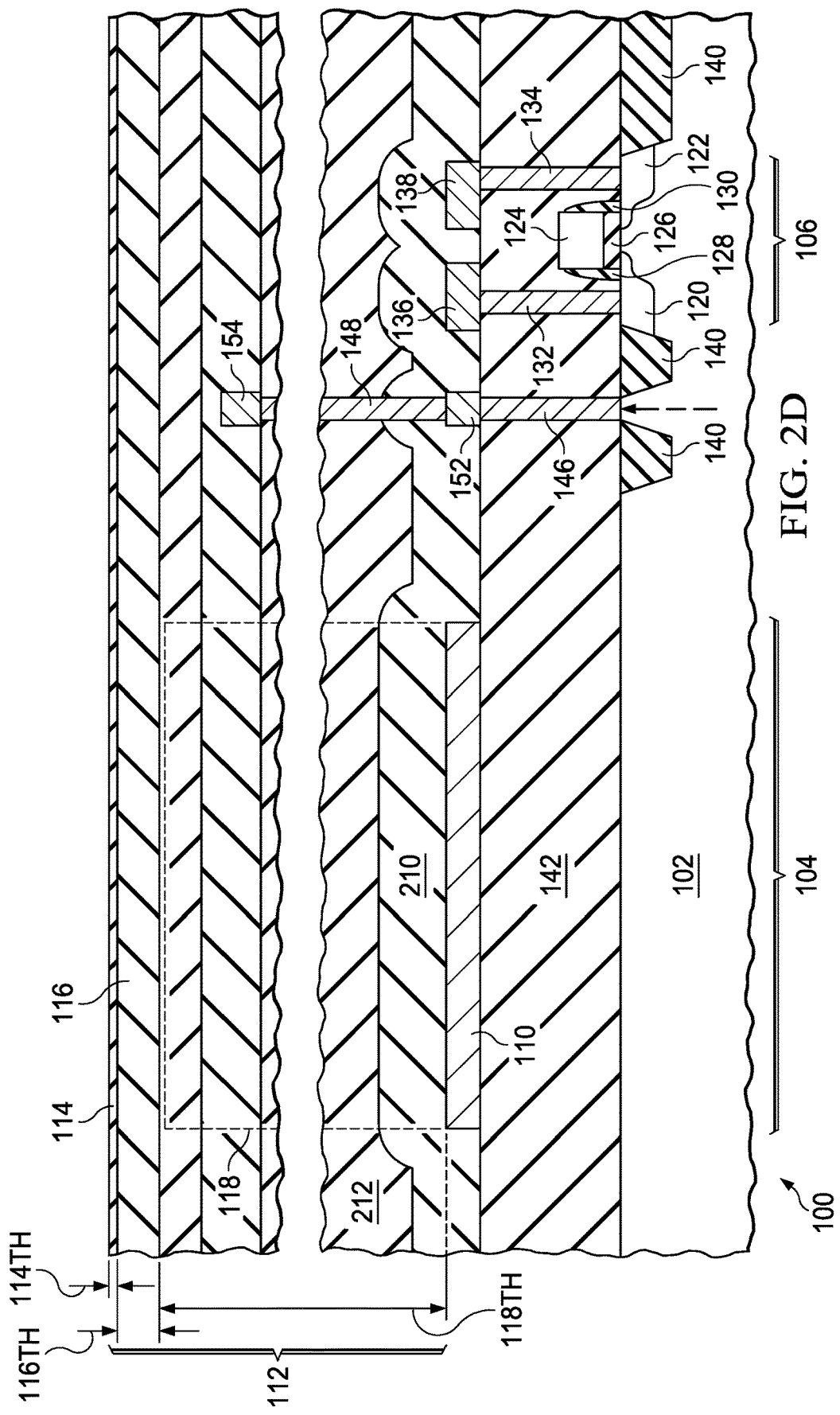
Figure 2E:
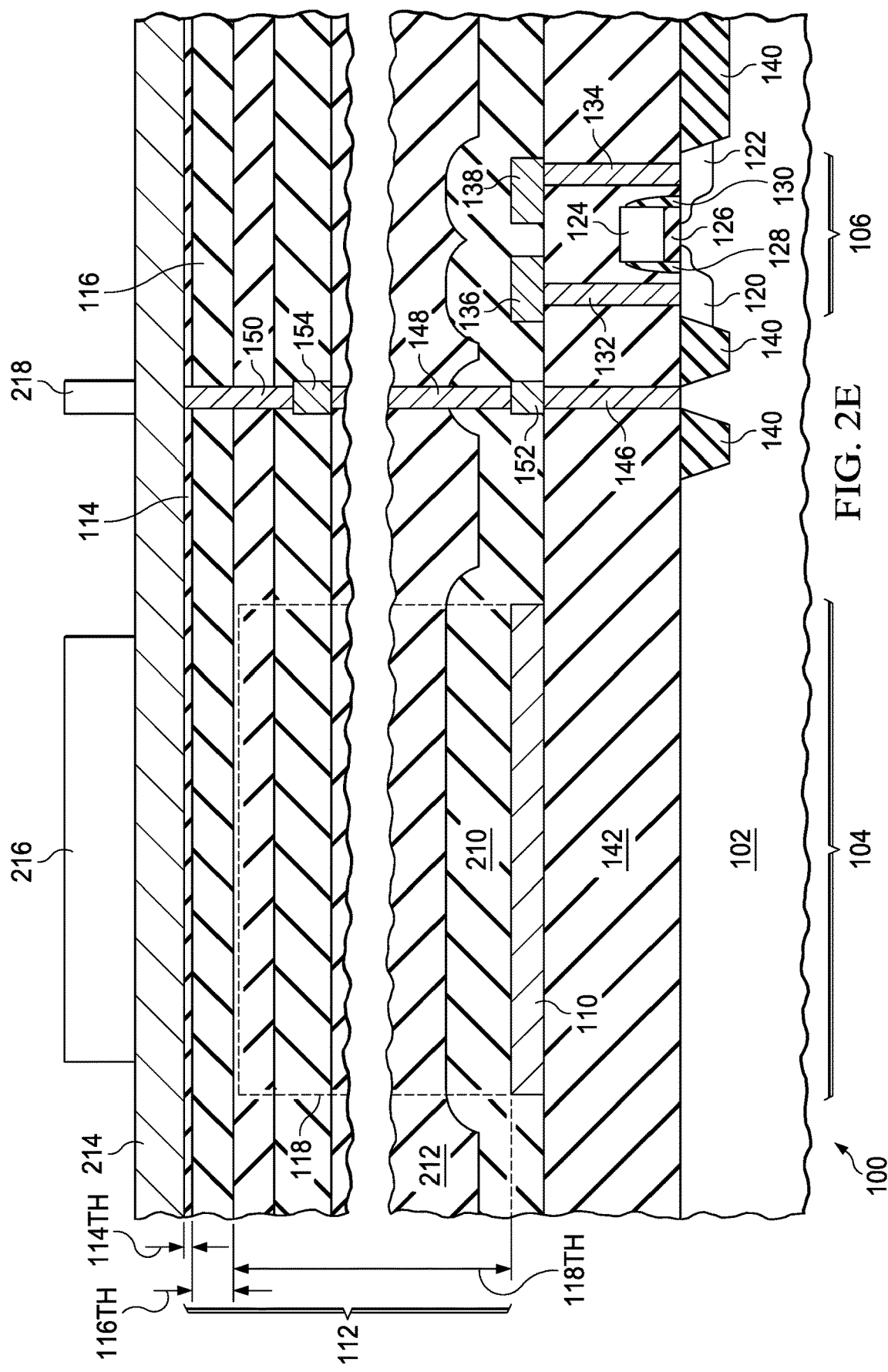
Figure 2F:
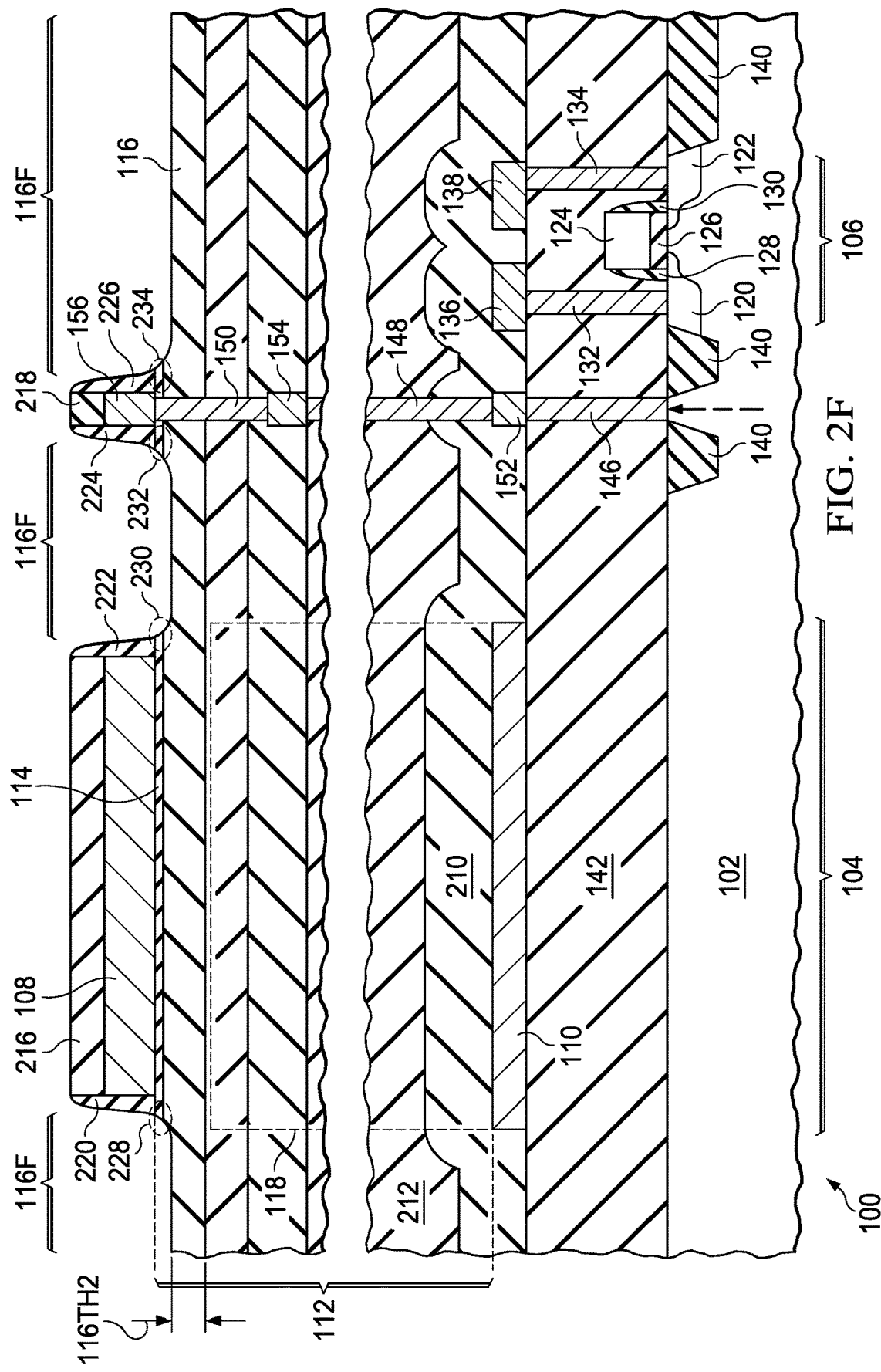
Figure 2G:
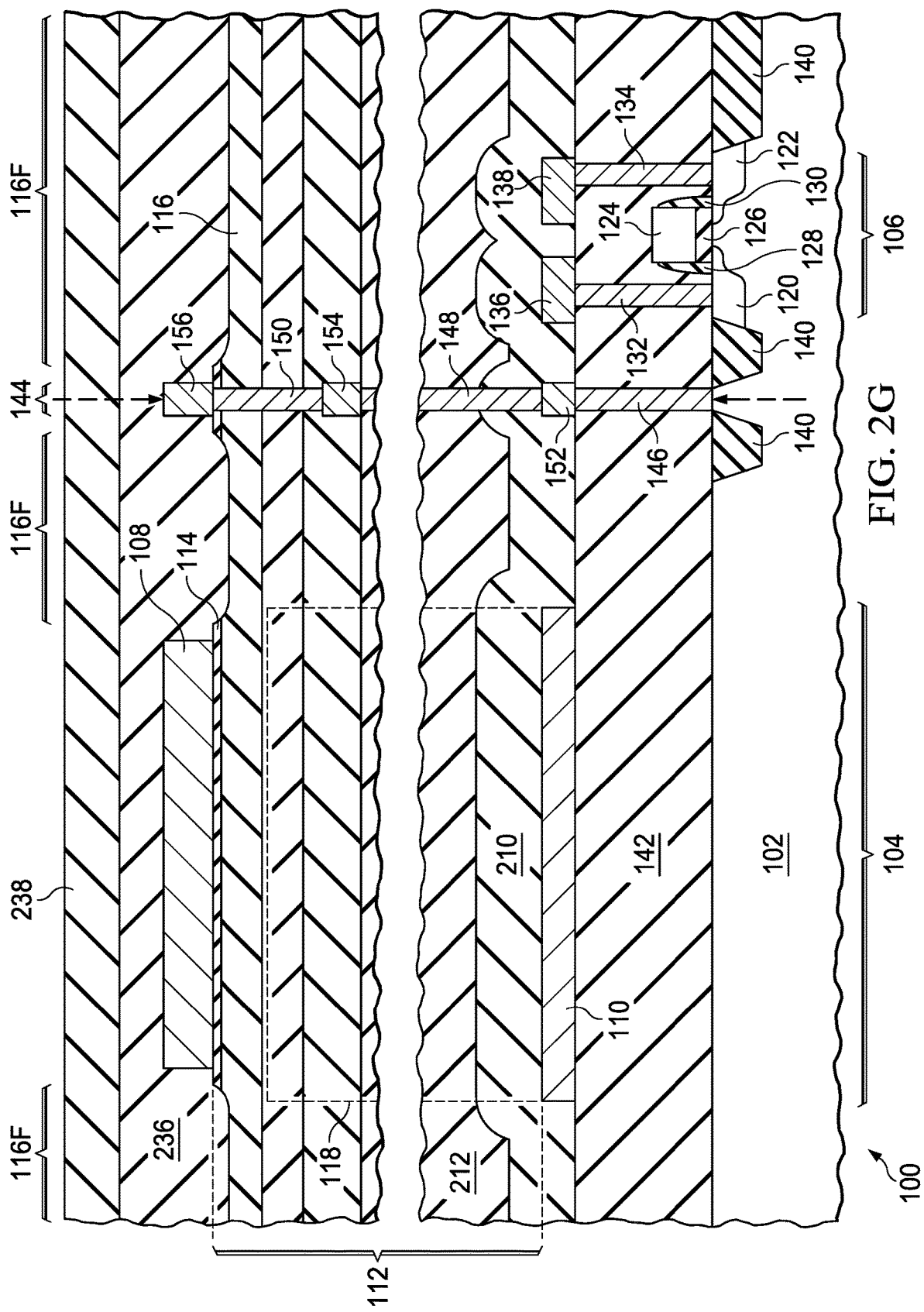
Figure 3:
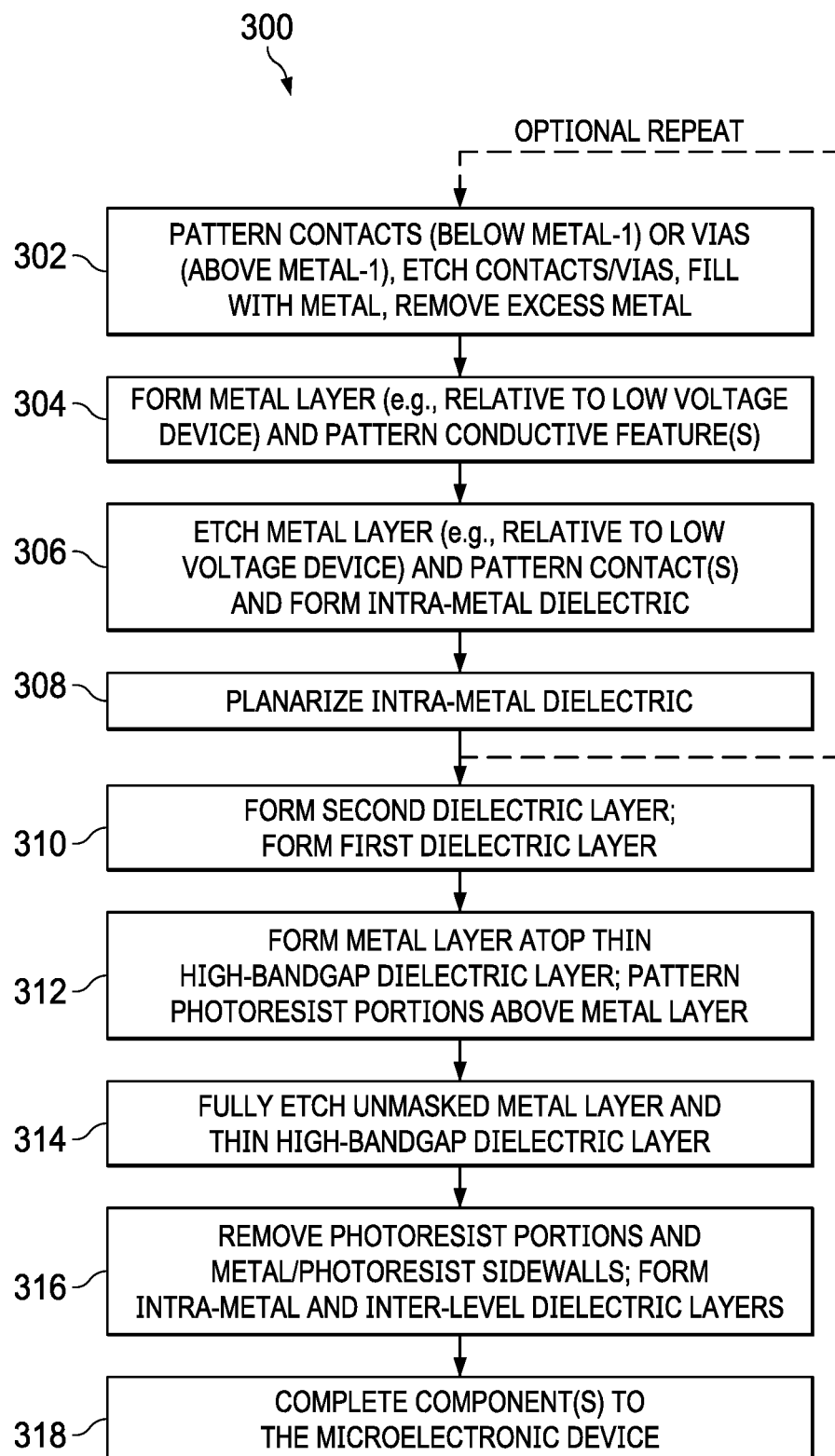
FIG. 3 is a flowchart of a method 300 that correlates to the fabrication steps illustrated in FIGS. 2A through 2G.

FIGS. 2A through 2G are cross-sectional views of the FIG. 1 microelectronic device 100 depicted in successive stages of fabrication, and FIG. 3 is a flowchart of a method 300 that correlates to the fabrication steps now described.

Referring to FIG. 2A and a step 302 in FIG. 3, for a dielectric layer (e.g., a pre-metal dielectric 142) holes are patterned for either contacts (before metal-1) or vias (after metal-1), where in FIG. 2A such holes correspond to contacts 132, 134, and 146. Also in the step 302, the holes are filled with metal and any excess metal is removed. The method 300 then proceeds to a step 304, where a first metal layer 200 is formed in a fixed position relative to the substrate 102 and optionally relative to a low voltage device, such as the MOS transistor 106. For example, prior to forming the first metal layer 200, the upper surface of the existing structure shown in FIG. 2A, such as the pre-metal dielectric 142, is planarized. Thereafter, the first metal layer 200 is formed along the planarized surface. Metal layers in semiconductor fabrication are often identified with successive numbering, so the first metal layer 200 may be considered a metal-1 layer. Next, photoresist portions 202, 204, 206, and 208 are patterned above the first metal layer 200.

Referring to FIG. 2B and a step 306 in FIG. 3, the FIG. 2A structure is etched, removing portions of the first metal layer 200 in unmasked areas. Accordingly, following the etch, a respective metal portion remains beneath each of the photoresist portions 202, 204, 206, and 208. Next, the photoresist portions 202, 204, 206, and 208 are removed, exposing the respective first metal layer portions, shown in FIG. 2B as the low voltage node 110 and the conductive metal-1 features 136, 138, and 152. An intra-metal dielectric layer 210 is then formed, for example of high density plasma oxide, and it is so named as it extends between the various metal features of the corresponding metal (e.g., metal-1) layer.

Referring to FIG. 2C and a step 308 in FIG. 3, the intra-metal dielectric later is effectively planarized by forming a planarized inter-level dielectric layer 212 over the FIG. 2B structure. At this point in the fabrication, therefore, the planarized inter-level dielectric layer 212 (in combination with portions of the intra-metal dielectric layer 210) provides layering of dielectric in a first position fixed close to, or in contact with, the low voltage node 110, which will be followed by additional dielectric layers to achieve the configuration shown in FIG. 1.

Also in FIG. 2C and after the step 308, optionally as shown by a dashed arrow in FIG. 3, the steps 302, 304, 306, and 308 may be repeated one or more times, with each repetition forming vias in the dielectric layer or stack planarized before the repetition (e.g., via 148 in FIG. 2C through layers 212 and 210), an additional metal layer with features patterned from it, and intra-layer dielectric between those features and a planarized inter-layer dielectric layer above it. In this manner, subsequent metal layers (e.g., metal-2, metal-3, etc.) and their corresponding structures are fabricated, as shown in partial form in FIG. 1. Once the desired number, if any, of repetitions of the steps 302, 304, 306, and 308 are complete, method 300 continues to a step 310.

Referring to FIG. 2D and the step 310 in FIG. 3, the preceding steps 302, 304, 306, and 308, and any optional repetition of those steps, thereby complete the FIG. 1 third dielectric layer 118. Next, the FIG. 1 second dielectric layer 116 is formed in a position relative to (e.g., atop) the third dielectric layer 118, so that the third dielectric layer 118 is between the second dielectric layer 116 and the low voltage node 110. In FIG. 2D the entire plane of the second dielectric layer 116 is shown, while in FIG. 1 already-etched portions of the second dielectric layer 116 are shown. Recall from the FIG. 1 discussion that the second dielectric layer 116 has a first thickness 116TH, for example of 7,000 Å (700 nm). Thereafter, also shown in FIG. 2D and the step 310, the first dielectric layer 114 is formed in a position relative to (e.g., atop) the second dielectric layer 116, so that the second dielectric layer 116 is between the first dielectric layer 114 and the third dielectric layer 118. The first dielectric layer 114 has a second thickness 114TH, for example of 2,000 Å (200 nm). Accordingly, the first dielectric layer 114 has a thickness that is 30 percent or less than that of the second dielectric layer 116. This 30 percent or less proportionality between layers of different bandgaps may be perceived as a remarkable change, as compared to some other high voltage devices, in that the relative thinness of the first dielectric layer 114 might be expected by some to provide too much vulnerability toward charge leakage or isolation failure. In an example embodiment, however, such relative thinness may be viable if not beneficial, in combination with other aspects described below.

Referring to FIG. 2E and a step 312 in FIG. 3, an additional metal layer 214 (e.g., aluminum) is formed in a position (e.g., atop) relative to the first dielectric layer 114, such that the dielectric layer stack 112—including layers 118, 116, and 114—is between the low voltage node 110 and the metal layer 214, as the high voltage node 108 is to be formed from the metal layer 214. In other words, the additional metal layer 214 is positioned and dimensioned so that, as shown below, a portion of the additional metal layer 214 is patterned to form the high voltage node 108 of the high voltage capacitor 104. For example, the additional metal layer 214 may have a thickness of 1.2 µm. Optionally and prior to forming the additional metal layer 214, the via 150 may be formed by forming a via hole through both the first dielectric layer 114 and the second dielectric layer 116, as well as through an upper portion of and the third dielectric layer 118, with metal then positioned into the via hole, thereby providing a conductive path and contact through other conductors to the substrate 102. Next, photoresist portions 216 and 218 are patterned above the additional metal layer 214. For reasons described below, in an example embodiment, the photoresist layer from which the photoresist portions 216 and 218 are formed is thicker than the additional metal layer 214, for example by at least 1.0 µm.

Referring to FIG. 2F and a step 314 in FIG. 3, an etch is performed above the photoresist portions 216 and 218. The etch removes a portion and thereby reduces the thickness of the photoresist portions 216 and 218, each of which has a thickness, greater than the FIG. 2E metal layer 214, that prevents the photoresist portions 216 and 218 from being fully etched by the step 312. Additionally, the step 312 etch also concurrently fully etches away the unmasked portions of the additional metal layer 214, so that the un-etched masked portions of the additional metal layer 214 form the high voltage node 108 and the conductive feature 156, which may be referred to as a contact 156. The contact 156 may be a low voltage node that provides a conductive path to the substrate 102. Additionally, the step 312 etch uses a chemistry that forms sidewall spacers 220 and 222 along the remaining sidewalls of the photoresist portion 216 and of the high voltage node 108, and similarly it forms sidewall spacers 224 and 226 along the remaining sidewalls of the photoresist portion 218 and of the contact 156. For example, the etch chemistry may include carbon fluorine (e.g., $CF_4$, $C_4F_8$, or $C_5F_8$) to create a plasma, whereby the fluorine etches the metal and the carbon creates the sidewall spacers 220, 222, 224, and 226. Further, once the step 312 etch removes all unmasked metal from the additional metal layer 214, the example embodiment step 312 continues the etch duration so as to etch fully through unmasked portions of the first dielectric layer 114 in field regions 116F that are outwardly (e.g., laterally) positioned relative to the high voltage node 108. Accordingly, note that the thickness of the first dielectric layer 114 is further selected so that it is thin enough that it may be etched through during the step 312 metal etch, using the same photoresist portion 216 that was present to protect the metal layer 214 that is etched to become the high voltage node 108. Further, once the step 314 etches fully through unmasked portions of the first dielectric layer 114, it may persist to begin to etch away an upper portion of the second dielectric layer 116, also in the field regions 116F. As the first dielectric layer 114 is being etched, however, note that the bottom portions of the sidewall spacers 220, 222, 224, and 226 each further mask a respective underlying portion of the first dielectric layer 114 from being etched. Accordingly, the first dielectric layer 114 has a portion with a length that remains not only under each respective metal portion and greater than the length of the respective metal portion (the high voltage node 108 and the contact 156), but each such portion of the thin first dielectric layer 114 also has laterally extending sidewalls 228, 230, 232, and 234 (each shown generally within a dashed oval), extending slightly laterally, with a slope or arcuate shape that is neither vertical nor parallel, relative to the sidewalls of each of those metal portions. The laterally extending sidewalls 228 and 230, therefore, are adjacent the high voltage node 108, thereby providing additional lateral high voltage protection during operation of the microelectronic device 100, while the absence of the dielectric layer laterally beyond the laterally extending sidewalls 228 and 230 essentially isolates one conductor from another, as there is no longer a continuous thin dielectric lateral path between those conductors along which charge can travel to create a lateral failure. Additionally, the remaining portions of the second dielectric layer 116 in the field regions 116F, once the first dielectric layer 114 is sufficiently etched to ensure it is removed in those field regions 116F, can be of a wide range of thicknesses. For example, the second dielectric layer 116 may be, deposited as 7,000 Å (700 nm) and etched down to a thickness from 3,000 Å to 6,500 Å (300 nm to 650 nm), with comparable performance. In all events, a same metal etch step is controlled chemically and by duration to etch metal as well as the entirety of the first dielectric layer 114 in the field regions 116F (laterally beyond the conductors), leaving a structure sufficiently robust to perform high voltage operations while reducing or eliminating lateral breakdown between a high voltage node and lower potential surrounding circuitry (e.g., between the high voltage node 108 and the contact 156).

Referring to FIG. 2G and a step 316 in FIG. 3, an oxygen ash is performed to the microelectronic device 100 as it appeared in FIG. 2F, to remove the photoresist portions 216 and 218 and the sidewall spacers 220, 222, 224, and 226. Thereafter, an intra-metal dielectric layer 236, optionally planarized, is formed atop the structure. Next, an inter-level dielectric layer 238 is formed over the structure, with the result shown in FIG. 2G. Following the step 316 and the depiction of FIG. 2G, an additional device completion step 318 occurs, in which any other components may be formed so as to result in the illustration of FIG. 1, including the formation of the wirebond 158 through the inter-level dielectric layer 238 and the intra-metal dielectric layer 236, and in contact with the high voltage node 108.

From the above, example embodiments include a method of forming, and the resulting structure of, a high voltage component in a microelectronic device. Example embodiments may improve the microelectronic device by eliminating, reducing, or controlling later charge flow in a high voltage device, by selectively removing portions of the continuous lateral plane of thin dielectric material between the high voltage device and other lower voltage components. Further, the selective removal is achieved as part of an existing process step required for formation of another component (e.g., high voltage node formation), so that an additional process step and/or mask is unneeded to accomplish the charge control benefits. Further, while the above-described attributes are shown in combination, the inventive scope includes other embodiments having subsets of one or more features described herein. Still further, also contemplated are changes in various parameters, including dimensions, with the preceding providing only some examples, with others ascertainable, from the teachings herein, by one skilled in the art. For example, certain materials or dimensions can be changed, such as the use of other dielectrics (e.g., for the first dielectric layer 114), including tantalum oxide and silicon carbide. Accordingly, additional modifications are possible in the described embodiments, and other embodiments are possible, within the scope of the following claims.

What is claimed is:

1. A method, comprising:
    forming a first voltage node of a high voltage component of a microelectronic device;
    forming a plurality of dielectric layers, including:
        forming a first layer in the plurality of dielectric layers in a first position that is fixed relative to the first voltage node, the first layer having a first thickness and a first bandgap;
        forming a second layer in the plurality of dielectric layers in a second position such that the first layer is between the second layer and the first voltage node, the second layer having a second thickness and a second bandgap;
        forming a third layer in the plurality of dielectric layers in a third position such that the second layer is between the third layer and the first voltage node, the third layer having a third thickness and a third bandgap;
    forming a second voltage node of the high voltage component of the microelectronic device in a fourth position such that the plurality of dielectric layers is between the first voltage node and the second voltage node, wherein during the forming a second voltage node step a portion of the third layer in a region laterally outwardly positioned relative to the second voltage node is removed to expose the second layer in the region.

2. The method of claim 1 wherein the first thickness is greater than the second thickness.

3. The method of claim 2 wherein the second thickness is greater than the third thickness.

4. The method of claim 1 wherein the second thickness is greater than the third thickness.

5. The method of claim 1 wherein the third thickness is less than thirty percent of the second thickness.

6. The method of claim 1 wherein the third layer includes silicon nitride.

7. The method of claim 1 wherein the second layer includes silicon oxynitride.

8. The method of claim 1:
    wherein the third layer includes silicon nitride; and
    wherein the second layer includes silicon oxynitride.

9. The method of claim 1 wherein the forming a second voltage node includes etching a metal layer to form the second voltage node and a low voltage node from the metal layer.

10. The method of claim 9 wherein the region outwardly positioned relative to the second voltage node is positioned between the second voltage node and a low voltage node.

11. The method of claim 1 wherein the first bandgap is greater than the second bandgap.

12. The method of claim 11 wherein the second bandgap is greater than the third bandgap.

13. A method, comprising:
    forming a first voltage node of a high voltage component of a microelectronic device;
    forming a plurality of dielectric layers adjacent the first voltage node, the plurality of dielectric layers including:
        a first dielectric layer farthest away, in the plurality of dielectric layers, from the first voltage node; and
        a second dielectric layer abutting the first dielectric layer and closer to the first voltage node relative to the first dielectric layer; and
    forming a second voltage node of the high voltage component of a microelectronic device adjacent the first dielectric layer, including etching a metal layer to provide the second voltage node wherein the etching fully etches through the first dielectric layer, to expose the second dielectric layer, in a region lateral with respect to the second voltage node.

14. The method of claim 13 wherein the step of forming the plurality of dielectric layers forms the first dielectric layer having a thickness less than a thickness of the second dielectric layer.

15. The method of claim 13 wherein the step of forming the plurality of dielectric layers forms the first dielectric layer having a bandgap less than a bandgap of the second dielectric layer.

16. The method of claim 13:
wherein the step of forming the plurality of dielectric layers forms the first dielectric layer having a thickness less than a thickness of the second dielectric layer; and
wherein the step of forming the plurality of dielectric layers forms the first dielectric layer having a bandgap less than a bandgap of the second dielectric layer.

* * * * *